(12) United States Patent
Littecke et al.

(10) Patent No.: US 8,409,668 B2
(45) Date of Patent: Apr. 2, 2013

(54) METHOD OF PRODUCING METAL CUTTING TOOLS

(75) Inventors: Peter Littecke, Huddinge (SE); Per Martensson, Nacka (SE)

(73) Assignee: Sandvik Intellectual Property AB, Sandviken (SE)

( * ) Notice: Subject to any disclaimer, the term of this patent is extended or adjusted under 35 U.S.C. 154(b) by 823 days.

(21) Appl. No.: 11/922,132

(22) PCT Filed: Jun. 16, 2006

(86) PCT No.: PCT/SE2006/000727
§ 371 (c)(1),
(2), (4) Date: May 27, 2008

(87) PCT Pub. No.: WO2006/135325
PCT Pub. Date: Dec. 21, 2006

(65) Prior Publication Data
US 2009/0068371 A1 Mar. 12, 2009

(30) Foreign Application Priority Data
Jun. 17, 2005 (SE) ...................................... 0501410

(51) Int. Cl.
*B05D 1/02* (2006.01)
(52) U.S. Cl. ........................................ 427/335; 427/427
(58) Field of Classification Search .................. 427/427; 428/335
See application file for complete search history.

(56) References Cited

U.S. PATENT DOCUMENTS

| | | | |
|---|---|---|---|
| 2,350,440 A | 6/1944 | Almen | |
| 4,125,969 A * | 11/1978 | Easton | 451/39 |
| 4,643,620 A | 2/1987 | Fujii et al. | |
| 4,674,365 A * | 6/1987 | Reed | 76/101.1 |
| 6,015,614 A * | 1/2000 | Ruppi | 428/335 |
| 6,120,570 A * | 9/2000 | Packer et al. | 51/309 |
| 6,869,334 B1 * | 3/2005 | Leyendecker et al. | 451/38 |
| 6,911,249 B2 * | 6/2005 | Wagner et al. | 428/141 |

FOREIGN PATENT DOCUMENTS

| | | |
|---|---|---|
| EP | 0 603 144 | 6/1994 |
| EP | 0 693 574 | 4/1998 |
| EP | 1 696 051 A1 | 8/2006 |
| EP | 1 734 155 A1 | 12/2006 |
| JP | 05-163423 | 6/1993 |
| JP | 06-246637 | 9/1994 |
| JP | 2003-500231 | 1/2003 |
| JP | 2003-076133 | 3/2003 |

OTHER PUBLICATIONS

Supplementary European Search Report dated Nov. 4, 2009, issued in EP 06 74 7919.6.
Notice of Reasons for Rejection against Japanese Patent Application No. 2008-516789, dated Nov. 22, 2011.

* cited by examiner

*Primary Examiner* — Timothy Meeks
*Assistant Examiner* — Nathan T Leong
(74) *Attorney, Agent, or Firm* — Morgan, Lewis & Bockius LLP

(57) ABSTRACT

The present invention relates to a method of producing metal cutting tools with outstanding performance in terms of toughness, wear resistance and resistance to coating delamination. According to the method the inserts are subjected to a stream of water mixed with blasting media under method conditions that result in an Almén value between 0.5 and 1.

14 Claims, No Drawings

METHOD OF PRODUCING METAL CUTTING TOOLS

RELATED APPLICATION DATA

This application is a §371 National Stage Application of PCT International Application No. PCT/SE2006/000727 filed Jun. 16, 2006, and also claims priority under 35 U.S.C. §119 and/or §365 to Swedish Application No. 0501410-5, filed in Sweden on Jun. 17, 2005.

The present invention relates to a method of producing metal cutting tools with outstanding performance in terms of toughness, wear resistance and resistance to coating delamination.

Modern tools for metal cutting must combine maximum resistance to wear, chipping and fracture with maximum resistance to plastic deformation. By adding a wear resistant coating by means of Physical Vapour Deposition, PVD, or Chemical vapour deposition, CVD, or a Plasma Activated Chemical Vapour Deposition, PACVD, technique the wear resistance can be dramatically improved compared to the uncoated insert. The wear resistance of the coated insert is often clearly dependent on the coating thickness and in the majority of the machining applications the wear resistance can be greatly improved if the thickness of the coating is increased. It must though be mentioned that an important prerequisite for a positive influence of the increased coating thickness is that the coating surface is sufficiently smooth to prevent sticking of the work piece material to the coating.

Depositing a coating on the substrate surface can besides giving increased performance in many applications also affect some properties negatively. The prolonged exposure of the insert to elevated temperatures for example during the long CVD method required to create a thick coating, can severely affect the toughness of the insert. Another problem with thicker coatings is that they often have a rough surface grain size. This will increase the risk of work piece material adhering to the insert surface during the machining operation which makes this type of inserts more subjected to delamination compared to a thinner coating, especially in very demanding applications. The loss of toughness in combination with the increased risk for coating delamination makes the insert more sensitive to the shape of the work piece and more prone to premature failure or even catastrophic failure.

The balancing of different properties of a cutting tool is a difficult task and explains the large variety of tools available on the market.

To reduce the risk of catastrophic failure of the coated insert, especially inserts with thick coatings often are combined with a base substrate having a cobalt enriched surface zone resulting in increased toughness with minimal loss of deformation resistance.

In order to counterbalance the negative effects of the coating method and further improve the properties of the coating itself numerous methods have been utilised and described in the literature. None of these has however yet proven to fully fulfil the requirements needed in order to achieve the desired properties of the insert in very demanding metal cutting applications.

U.S. Pat. No. 4,643,620 teaches that toughness can be improved by reducing the coating thickness along the cutting edge.

EP-A-693574 teaches that by removing a top layer of TiCNO on the edge line or the insert top thus exposing a layer of fine grained $Al_2O_3$, the resistance to flaking at the edge can be dramatically reduced. It is also concluded that a smoother surface is not enough to improve the flaking resistance if it is not in combination with a fine grained Al2O3 as the outer layer.

Various blasting conditions are specified in the above patent reaching from blasting pressures of 1.0 to 2.0 bars and grit size from 150 to 325 mesh. It has now been found that optimizing the blasting method by using a higher pressure and the right concentration of blasting grit and water, the performance of the insert can be improved to outstanding levels.

It is the purpose of this invention to teach a method of treating CVD-coated inserts through a blasting/shotpeening operation using a mixture of water and aluminium oxide powder at certain conditions in order to produce an insert with an absolutely outstanding combination of properties.

The blasting effect is influenced by a number of factors such as grain size, pressure, pulp concentration, distance between insert and nozzle, time of exposure and the number of combinations to mention a few. Instead of trying to specify all combinations that would give a good result it is easier to use the method described in U.S. Pat. No. 2,350,440. known as the Almén test. This test involves exposing a thin strip of metal to the blasting/peening jet. The bombardment of particles causes a change in the residual stress level which in turn causes the metal strip to flex in one direction. Measuring the amount of bending gives a value of blasting conditions and their influence on the surface stresses.

According to the present invention there is provided a method of making coated cutting tools for metal cutting by subjecting the coated tools to a stream of water mixed with blasting media under such conditions that result in an Almén value between 0.5 and 1. Preferably the outermost layer of the coating is $Al_2O_3$. The blasting medium is $Al_2O_3$ or SiC, preferably $Al_2O_3$. Preferably the average concentration of the blasting media is more than 15 vol-% but below 35 vol-% and the average grain size is 75 μm.

EXAMPLE 1

Cemented carbide inserts coated with 6 μm of TiCN and 4,5 μm of α-aluminium oxide and 0.5 μm TiN on the top were exposed to blasting according to the invention at different pressures and exposure times according to table 1. All inserts were tested in a metal cutting operation with severe interrupted cut. Ten inserts of each variant were run until fracture occurred and the time recorded.

TABLE 1

Time to fracture at different pressures and exposure times.

| | Pressure | | |
| --- | --- | --- | --- |
| Time | P = 2.0 bar | P = 2.2 bar | P = 2.4 bar |
| 0 s (untreated) | 50 s | | |
| 15 s | 86 s | 100 s | 123 s |
| 30 s | 110 s | | 164 s |

As can clearly be seen, the increase in fracture resistance is almost three times on inserts blasted with the highest pressure for the longest time.

EXAMPLE 2

Measurement strips of the thinnest type, N-strip grade 1-S, were exposed to typical data for surface blasting of inserts.

Keeping such parameters as grain size, pulp density, nozzle distance and time only the pressure was varied. The result is found in Table 2.

TABLE 2

Strip deflection at different pressures

| | P = 1.8 bar | P = 2.0 bar | P = 2.2 bar | P = 2.4 bar | P = 2.6 bar |
|---|---|---|---|---|---|
| Amount of deflection, mm | 0.011 | 0.016 | 0.021 | 0.028 | 0.033 |
| Almén-value | 0.3 | 0.5 | 0.7 | 0.9 | 1.1 |

Exposing inserts to the highest pressure is likely to result in the coating being removed in the edge line, making 2.6 bars or an Almén-value of 1.1 too high for practical production.

The invention claimed is:

1. A method of making coated tools for metal cutting comprising subjecting an insert to a stream of water mixed with a grit blasting media under conditions that result in an Almén value between 0.5 and 1, wherein the grit blasting media is aluminum oxide, and wherein an average concentration of the grit blasting media is more than 15 vol-% but below 35 vol-%.

2. The method according to claim 1, wherein the insert is coated with a coating including an outermost layer of $Al_2O_3$.

3. The method according to claim 1, wherein the grit blasting media has an average grain size of 75 μm.

4. The method of claim 1, wherein the insert is coated with a coating including an innermost layer of TiCN, a layer of $Al_2O_3$, and an outermost layer of TiN.

5. The method of claim 4, wherein the $Al_2O_3$ is $\alpha$-$Al_2O_3$.

6. The method of claim 1, wherein the conditions include a pressure of less than or equal to about 2.4 bar.

7. The method of claim 1, wherein the conditions include a pressure of greater than or equal to about 1.8 bar to less than or equal to about 2.4 bar.

8. The method of claim 1, wherein the conditions include a pressure of about 2.0 bar to about 2.4 bar.

9. A method of making coated tools for metal cutting comprising subjecting an insert to a stream of water mixed with a grit blasting media under conditions that result in an Almén value between 0.5 and 1, wherein the grit blasting media is SiC, and wherein an average concentration of the grit blasting media is more than 15 vol-% but below 35 vol-%.

10. The method according to claim 9, wherein the grit blasting media has an average grain size of 75 μm.

11. The method according to claim 9, wherein the insert is coated with a coating including an outermost layer of $Al_2O_3$.

12. The method of claim 9, wherein the insert is coated with a coating including an innermost layer of TiCN, a layer of $Al_2O_3$, and an outermost layer of TiN.

13. The method of claim 12, wherein the $Al_2O_3$ is $\alpha$-$Al_2O_3$.

14. The method of claim 9, wherein the conditions include a pressure of about 2.0 bar to about 2.4 bar.

* * * * *